United States Patent
Lin et al.

(10) Patent No.: US 8,420,413 B2
(45) Date of Patent: Apr. 16, 2013

(54) METHOD FOR MANUFACTURING PIXEL STRUCTURE

(75) Inventors: Hsiang-Lin Lin, Hsinchu (TW);
Ching-Yu Tsai, Hsinchu (TW);
Yi-Sheng Cheng, Hsinchu (TW);
Kuo-Yu Huang, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 160 days.

(21) Appl. No.: 13/174,795

(22) Filed: Jul. 1, 2011

(65) Prior Publication Data
US 2011/0263053 A1  Oct. 27, 2011

Related U.S. Application Data

(62) Division of application No. 11/740,937, filed on Apr. 27, 2007, now Pat. No. 8,018,013.

(30) Foreign Application Priority Data

Nov. 30, 2006 (TW) ............... 95144596 A

(51) Int. Cl.
*H01L 29/72* (2006.01)

(52) U.S. Cl.
USPC ........................... 438/22; 257/E33.053

(58) Field of Classification Search ............ 438/22; 257/E33.053
See application file for complete search history.

(56) References Cited

U.S. PATENT DOCUMENTS 5,459,596 A * 10/1995 Ueda et al. ............... 349/39

* cited by examiner

*Primary Examiner* — Edward Wojciechowicz
(74) *Attorney, Agent, or Firm* — Jianq Chyun IP Office

(57) ABSTRACT

A pixel structure including a scan line, a data line, an active device, a shielding electrode, and a pixel electrode is provided on a substrate. The data line includes an upper conductive wire and a bottom conductive wire. The upper conductive wire is disposed over and across the scan line. The bottom conductive wire is electrically connected to the upper conductive wire. The active device is electrically connected to the scan line and the upper conductive wire. The shielding electrode is disposed over the bottom conductive wire. The pixel electrode disposed over the shielding electrode is electrically connected to the active device. In addition, parts of the pixel electrode and parts of the shielding electrode form a storage capacitor.

14 Claims, 13 Drawing Sheets

METHOD FOR MANUFACTURING PIXEL STRUCTURE

CROSS-REFERENCE TO RELATED APPLICATION

This is a divisional application of patent application Ser. No. 11/740,937, filed on Apr. 27, 2007, which claims the priority benefit of Taiwan application serial no. 95144596, filed on Nov. 30, 2006. The entirety of each of the above-mentioned patent applications is hereby incorporated by reference herein and made a part of this specification.

BACKGROUND OF THE INVENTION

1. Field of the Invention

The present invention relates to a pixel structure and a method for manufacturing thereof and, more particularly, to a pixel structure having a shielding electrode and a method for manufacturing thereof.

2. Description of Related Art

The thin film transistor liquid crystal display (TFT-LCD) mainly includes a TFT array substrate, a color filter substrate, and a liquid crystal layer disposed between the TFT array substrate and the color filter substrate. The TFT including a gate, an active layer, a source, and a drain is usually adopted as a switch. The TFT includes an amorphous silicon (a-Si) TFT and a poly-silicon TFT according to the material of the active layer. The poly-silicon TFT has less power consumption and better electron mobility in comparison with the a-Si TFT. Moreover, an LCD using a low temperature poly-silicon TFT as a switch has advantages of slimness, compactness, high resolution, and so forth. Thus, the low temperature poly-silicon TFT is frequently deployed in portable products that demand low power consumption.

The pixel structure of the conventional poly-silicon TFT LCD includes a scan line, a data line, a poly-silicon TFT, and a pixel electrode. Here, the distance between the pixel electrode and the data line is a major factor determining the aperture ratio of the pixel structure. Said aperture ratio directly affects the backlight source utilization and further influences display brightness of the LCD. In the pixel structure, the parasitical capacitance Cpd (capacitance between the pixel electrode and the data line) increases as the distance between the pixel electrode and the data line is excessively decreased. Thereby, the potential of the pixel electrode is affected by the signal transmitting in the data line when the poly-silicon TFT is switched off, which leads to a cross-talk effect and further to deterioration of the display quality of the LCD.

To reduce the cross-talk effect induced in the pixel structure without affecting the aperture ratio of the pixel structure, many designs of pixel structures have been developed one after another.

FIG. 1 is a schematic cross-sectional view of a conventional pixel structure. Referring to FIG. 1, the conventional pixel structure 100 disposed on a substrate 110 includes a scan line (not shown), a data line 130, an active device 140, a pixel electrode 150, and a planarization layer 160. Both the scan line and the data line 130 are disposed on the substrate 110. The active device 140 is disposed on the substrate 110 at the intersecting place between the scan line and the data line 130 and is electrically connected to the scan line and the data line 130. The pixel electrode 150 is electrically connected to the active device 140. The planarization layer 160 is disposed over the substrate 110, such that an edge of the pixel electrode 150 extends over the data line 130 so as to increase the aperture ratio.

The thickness of the planarization layer 160 is greater than other layers and is often fabricated with a low dielectric constant (low-K) material. Hence, the influence of the parasitical capacitance Cpd on the pixel electrode 150 is reduced. However, the organic material e.g. acrylic resin widely-used in a manufacturing process of the planarization layer 160 is likely to deteriorate the adhesive strength due to its superior water absorptivity. In addition, the transmittance of the pixel structure declines since the material of the organic material cannot be completely bleached.

On the other hand, in the pixel structure 100, the storage capacitor is formed by a first metal layer 144 (an upper electrode) and a poly-silicon layer 142 (a bottom electrode), and the performance of the storage capacitor relates to the electrical conductivity of the upper and the bottom electrodes. Since a portion of the poly-silicon layer 142 is covered by the first metal layer 144 disposed over the poly-silicon layer 142, an ionic doping process of the poly-silicon layer 142 cannot be performed with ease, and therefore the electrical conductivity of the poly-silicon layer 142 is reduced. To enhance the performance of the storage capacitor to a certain degree, the driving potential is correspondingly increased.

SUMMARY OF THE INVENTION

The present invention provides a pixel structure having a shielding electrode.

The present invention provides a display panel having said pixel structure.

The present invention provides a method for manufacturing a pixel structure, and the manufacturing method is compatible with current manufacturing processes.

The present invention provides an electro-optic apparatus having said display panel.

The present invention provides a pixel structure including a scan line, a data line, an active device, a shielding electrode, and a pixel electrode is provided on a substrate. The scan line and the data line are disposed on the substrate, and the data line includes an upper conductive wire and a bottom conductive wire. The upper conductive wire is disposed over and across the scan line. The bottom conductive wire is electrically connected to the upper conductive wire. The active device is disposed on the substrate and is electrically connected to the scan line and the upper conductive wire. The shielding electrode is disposed over the bottom conductive wire. The pixel electrode is disposed over at least part of the shielding electrode and is electrically connected to the active device. Furthermore, parts of the pixel electrode and parts of the shielding electrode form a storage capacitor.

The present invention further provides a display panel including a plurality of pixel structures arranged in array on a substrate according to an embodiment of the present invention.

The present invention further provides a method for manufacturing a pixel structure. The method includes forming an active device, a scan line, and a bottom conductive wire on a substrate. Here, the active device is electrically connected to the scan line. An upper conductive wire and a shielding electrode are formed. The shielding electrode is disposed over the bottom conductive wire, and the upper conductive wire is electrically connected to the active device. A pixel electrode electrically connected to the active device is formed and is disposed over at least part of the shielding electrode. Parts of the pixel electrode and parts of the shielding electrode form a storage capacitor.

In the present invention, a formation of the shielding electrode between the data line and the pixel electrode in the pixel structure reduces the influence of the data line on the potential of the pixel electrode during signal transmission. Moreover, the shielding electrode shields the electrical field generated by the data line during transmission of various potentials, and thereby the influence of the data line on the pixel electrode is significantly reduced. Accordingly, the pixel electrode can be designed to extend over the data line, which increases the aperture ratio of the pixel structure and further improves the display brightness of the LCD.

DESCRIPTION OF EMBODIMENTS

First Embodiment

Figure 2A:
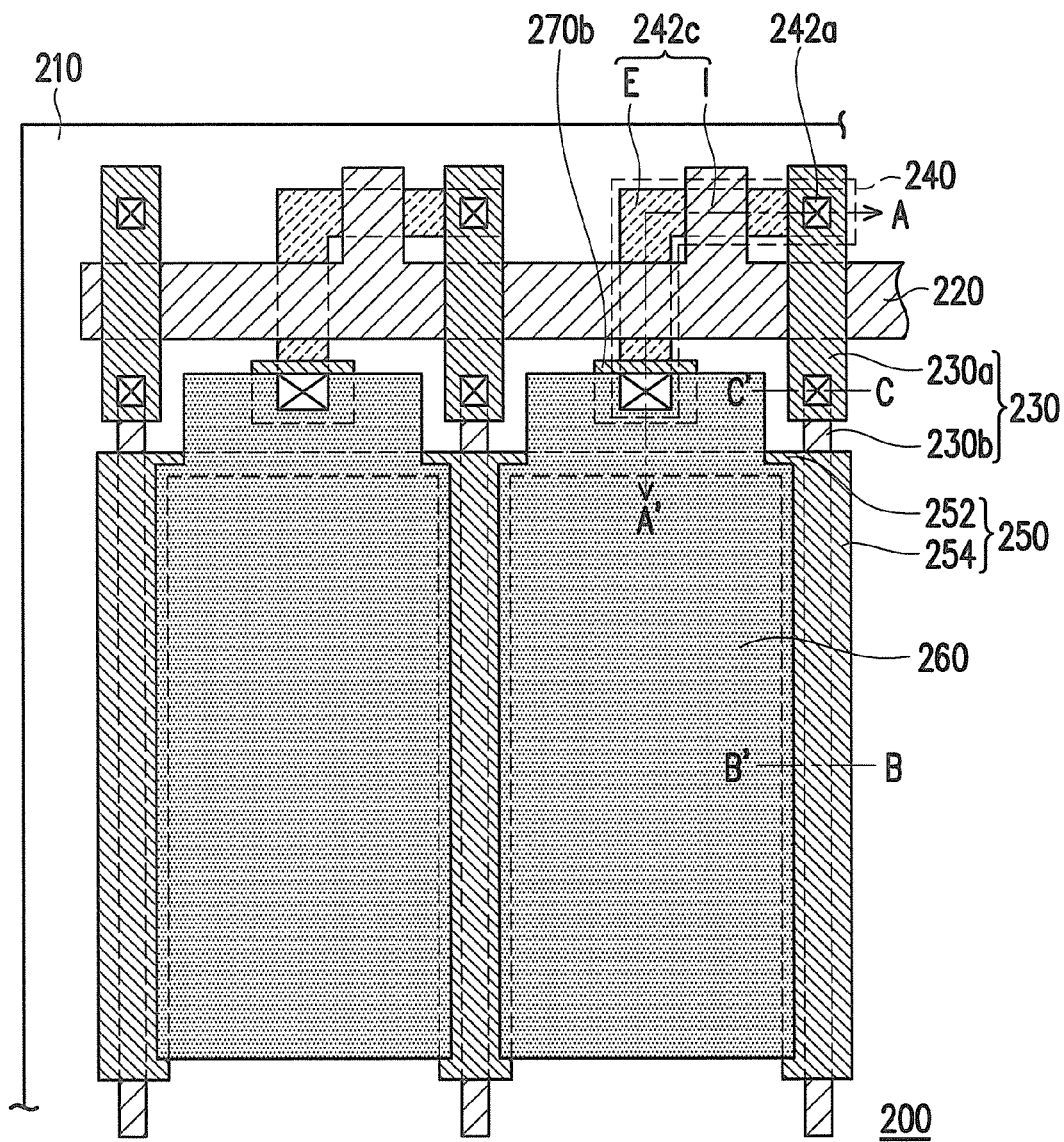
FIG. 2A is a schematic view of a pixel structure according to one embodiment of the present invention.
Figure 2B:
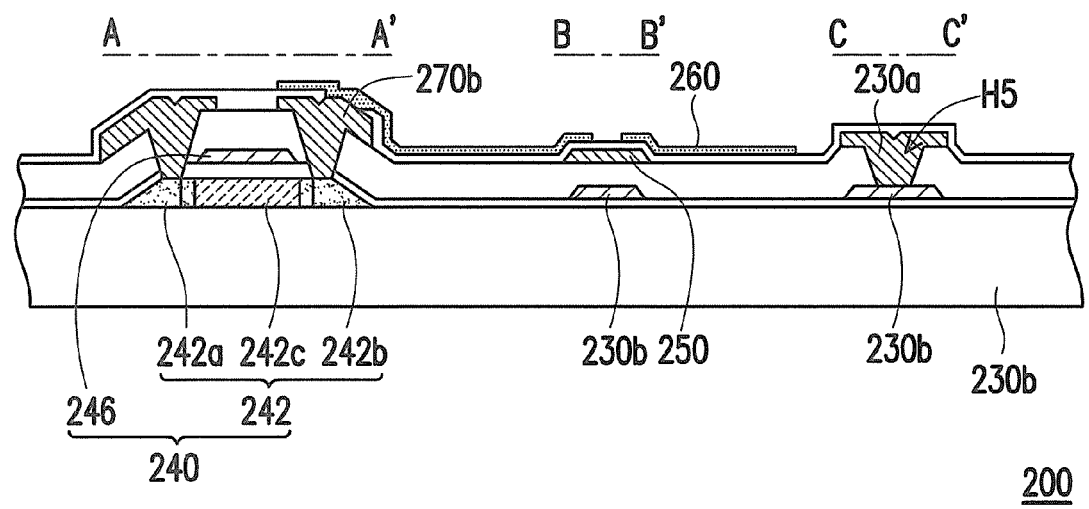
FIG. 2B is a schematic cross-sectional view depicted along lines A-A', B-B', and C-C' in FIG. 2A.

FIG. 2A is a schematic view of a pixel structure arranged in array on a substrate according to one embodiment of the present invention, and FIG. 2B is a schematic cross-sectional view depicted along lines A-A', B-B', and C-C' in FIG. 2A. Referring to FIG. 2A, the display panel of the present embodiment includes a plurality of pixel structures 200 arranged in array on a substrate 210. For illustrative convenience, only two pixel structures 200 are depicted in FIG. 2A.

Referring to FIGS. 2A and 2B, the pixel structure 200 of the present embodiment is disposed on the substrate 210 and includes a scan line 220, a data line 230, an active device 240, a shielding electrode 250, and a pixel electrode 260. The scan line 220 is disposed on the substrate 210. The data line 230 is disposed on the substrate 210 and includes an upper conductive wire 230a and a bottom conductive wire 230b. The upper conductive wire 230a is disposed over and across the scan line 220. The bottom conductive wire 230b is electrically connected to the upper conductive wire 230a. To diminish a contact resistance between the data conductive wires 230a and 230b so as to overcome the hindrance of data transmission, parts of the bottom conductive wire 230b and parts of the upper conductive wire 230a overlap and contact each other in the overlapping area. In other embodiments, however, the bottom conductive wire 230b and the upper conductive wire 230a may not overlap and is electrically connected to each other through a third conductive material. The third conductive material includes a transparent material (e.g. indium tin oxide, indium zinc oxide, aluminum zinc oxide, zinc oxide or others), a reflective material (e.g. gold, silver, copper, iron, lead, chromium tin, molybdenum (Mo), neodymium (Nd), titanium (Ti), tantalum, an alloy thereof, nitride thereof, oxide thereof, or any combination thereof), or any combination thereof. The active device 240 is disposed on the substrate 210 and is electrically connected to the scan line 220 and the upper conductive wire 230a. The shielding electrode 250 is disposed over the bottom conductive wire 230b so as to shield the electrical field of the bottom conductive wire 230b. The pixel electrode 260 is disposed over part of the shielding electrode 250 and is electrically connected to the active device 240. Furthermore, parts of the pixel electrode 260 and parts of the shielding electrode 250 form a storage capacitor.

In the present embodiment, the active device 240 is, for example, a TFT including a top-gate thin film transistor, bottom gate thin film transistor, or other types of transistors. The top-gate thin film transistor includes a single gate poly-silicon TFT, a dual gate poly-silicon TFT, or other transistors. In the present embodiment, the poly-silicon TFT made through a low temperature process is taken for an example, but the present invention is not limited to low-temperature poly-silicon TFT. In other embodiments, the active device 240 can also be an a-Si TFT, a monocrystalline silicon TFT, a microcrystalline silicon TFT, or other material TFT (such as germanium), or any combination thereof.

According to the present embodiment, the active device 240 is formed by a semiconductor layer 242 and a gate 246. The semiconductor layer 242 includes a source region 242a electrically connected to the upper conductive wire 230a and a drain region 242b (shown in FIG. 2B) electrically connected to the pixel electrode 260. However, to diminish the contact resistance between the pixel electrode 260 and the active device 240, a drain 270b is simultaneously constructed when the shielding electrode 250 and the upper conductive wire 230a are formed, such that the pixel electrode 260 is electrically connected to the drain region 242b through the drain 270b. Moreover, the semiconductor layer 242 further includes a turning portion 242c connected between the source region 242a and the drain region 242b. Here, the semiconductor layer 242 disposed under the scan line 220 is undoped and is called an intrinsic semiconductor I, while the semiconductor layer 242 which is not covered by the scan line 220 is doped and is called an extrinsic semiconductor E. The turning portion 242c includes the intrinsic semiconductor I and the extrinsic semiconductor E. On the other hand, according to the present embodiment, the turning portion 242c is a substantially 90-degree turning, and the source region 242a, the drain region 242b, and the turning portion 242c are substantially arranged in an L-shape, but not limited it. In other embodiments, however, the turning portion 242c may be an arc turning or other non-90-degree turnings; in other words, the semiconductor layer 242 is substantially arranged in a U-shape, an S-shape, or other shapes, or combinations thereof.

According to the present embodiment, a width of the shielding electrode 250, preferred, is substantially greater than or substantially equal to that of the bottom conductive wire 230b, and the shielding electrode 250, preferred, has an extending portion 252 which extends along a direction of at least one of the scan line 220 and the data line 230, such that the extending portion 252 is electrically connected to the shielding electrode 250 at the left and the right sides of the pixel. In other words, the extending portion 252 extends under the pixel electrode 260. The present invention is embodied but not limited by providing the extending portion 252 which extends along a direction of the scan line 220. Alternatively, at least one of the extending portions 252 of the shielding electrodes 250 at the left and the right sides of the pixel extend along the direction of the scan line 220, but said extending portion 252 is not electrically connected to the shielding electrode 250. A length to which the extending portion 252 extends is determined by the required aperture ratio. In other words, there is a distance between at least one of the extending portions 252 of the shielding electrodes 250 at the left and the right sides of the pixel and any of the shielding electrodes 250. The extending portion 252 may also extend along the direction of the data line 230 and then along the direction of the scan line 220. The desired design of the aperture ratio determines if another shielding electrode 250 is electrically connected/non-electrically connected to the extending portion 252. The extending portion 252 may also extend along the direction of the scan line 220, along the direction of the data line 230, and then along the direction of the scan line 220 once again. The desired design of the aperture ratio determines if another shielding electrode 250 is electrically connected/non-electrically connected to the extending portion 252. Other possible ways are likely to be taken as examples to embody the present invention as well. According to the embodiment of the present invention, each shielding electrode 250 in the pixel structure 200 of the display panel, is connected to one another through said extending portion 252, and preferred is electrically connected to a potential, so as to shield the electrical field generated by each bottom conductive wire 230b during transmission of the data. Thereby, the potential of the pixel electrode 260 is not affected, and the display quality remains consistent. Here, the potential of the shielding electrode 250 may include a common potential or other potentials.

Figure 3A:
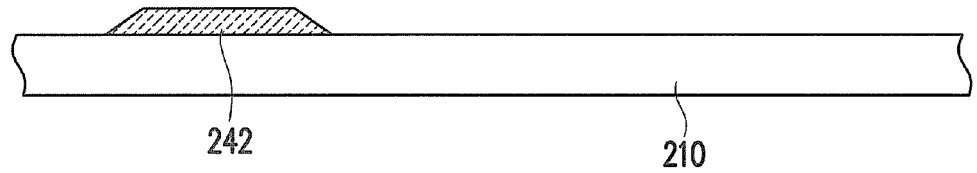
FIGS. 3A through 3G are schematic views depicting a method for manufacturing a pixel structure according to a first embodiment of the present invention.

FIGS. 3A through 3G are schematic views depicting a method of manufacturing a pixel structure according to the first embodiment of the present invention. Please refer to FIGS. 3A~3C. The active device 240, the scan line 220, and the bottom conductive wire 230b are formed on the substrate 210. Here, the material of the substrate 200 includes a transparent material (e.g. glass, quartz, or others), a non-transparent material (e.g. silicon, ceramic, or others), or a flexible material (e.g. plastic, polypropylene polymer, polyester polymer, polystyrene polymer, or other polymers). The present embodiment takes glass as an example. The active device 240 is a TFT formed by the gate 246 and the semiconductor layer 242 having the source region 242a and the drain region 242b, for example. Referring to FIG. 3A, the semiconductor layer 242 is formed on the substrate 210 first. Here, the method of forming the semiconductor layer 242 includes, for example, a low-pressure chemical vapor deposition (LPCVD) process. Then, a recrystallization process and a patterning process are subsequently performed so as to form the semiconductor layer 242. Said recrystallization process and said patterning process may be performed in a reverse order.

Figure 3B:
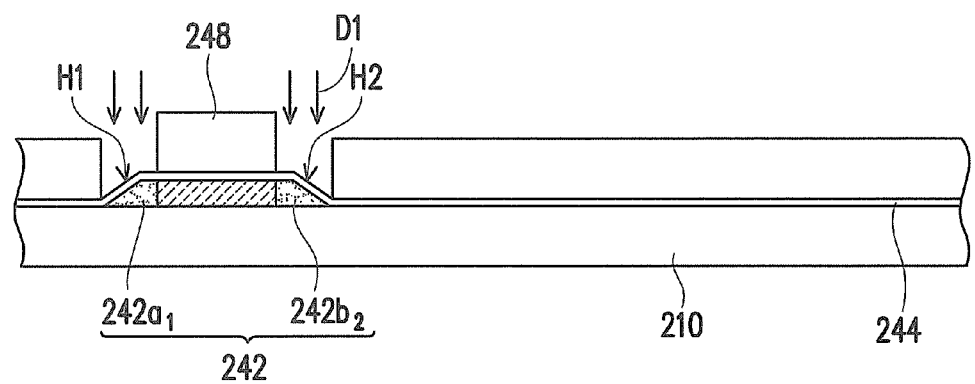

As shown in FIG. 3B, a first dielectric layer 244 is formed on the substrate 210 to cover the semiconductor layer 242. Thereafter, a first patterned photoresist layer 248 is formed on the first dielectric layer 244. Here, the first patterned photoresist layer 248 has openings H1 and H2 located over two sides of the semiconductor layer 242, respectively. The openings H1 and H2 are used to define positions of first doped regions $242a_1$ and $242b_1$. The first patterned photoresist layer 248 is then used as a mask to perform a first doping process D1. In additional, the first doping process D1 is a heavily doping process according to the present embodiment. According to the present embodiment, the method of forming the first dielectric layer 244 on the substrate 210 includes, for example, a chemical vapor deposition (CVD) process. The material of the first dielectric layer 244 includes, for example, silicon oxide, silicon nitride, silicon oxynitride (SiON), silicon carbide, organic silicon, or any combination thereof.

Figure 3C:
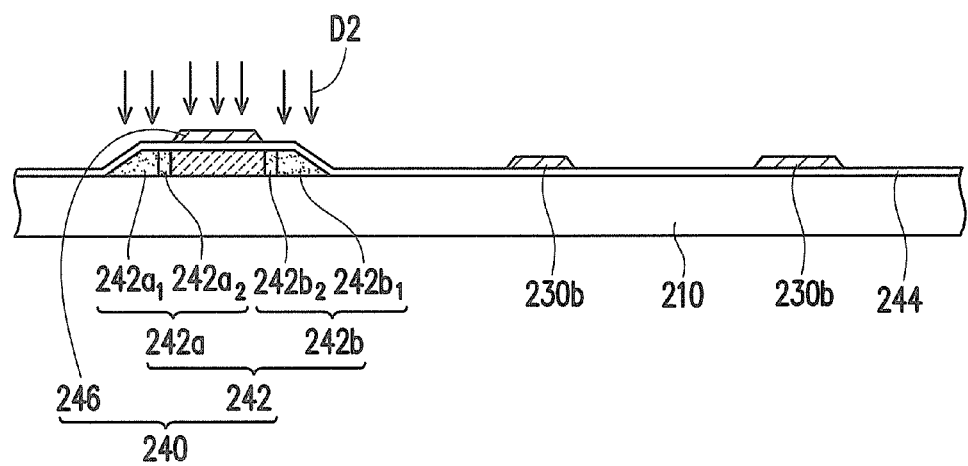

Referring to FIG. 3C. After the first doping process D1 is performed, the first patterned photoresist layer 248 (shown in FIG. 3B) is removed. Next, the gate 246, the scan line 220, and the bottom conductive wire 230b are simultaneously formed on the first dielectric layer 244. Here, the gate 246 is disposed over the semiconductor layer 242, and the scan line 220 is electrically connected to the active device 240. According to the present embodiment, second doped regions $242a_2$ and $242b_2$ are formed in the semiconductor layer 242 after the formation of the gate 246. As shown in FIG. 3C, the second doped regions $242a_2$ and $242b_2$ are formed simultaneously and are disposed adjacent to the first doped regions $242a_1$ and $242b_1$ at the two sides of the semiconductor layer 242. In other embodiment, selectively only one of the second doped regions $242a_2$ and $242b_2$ can be doped at one side of the first doped regions $242a_1$ or $242b_1$. The method of forming the second doped regions $242a_2$ and $242b_2$ includes using the gate 246 as a mask to perform a second doping process D2, such that the semiconductor layer 242 at two sides of the gate 246 forms the source region 242a and the drain region 242b including the first doped regions $242a_3$ and $242b_1$ and the second doped regions $242a_2$ and $242b_2$. In the present embodiment, the method of forming the gate 246 includes, for example, forming a first metal layer on the substrate 210 and then patterning the first metal layer to form the gate 246. Here, the second doping process D2 is a lightly doping process.

Figure 3D:
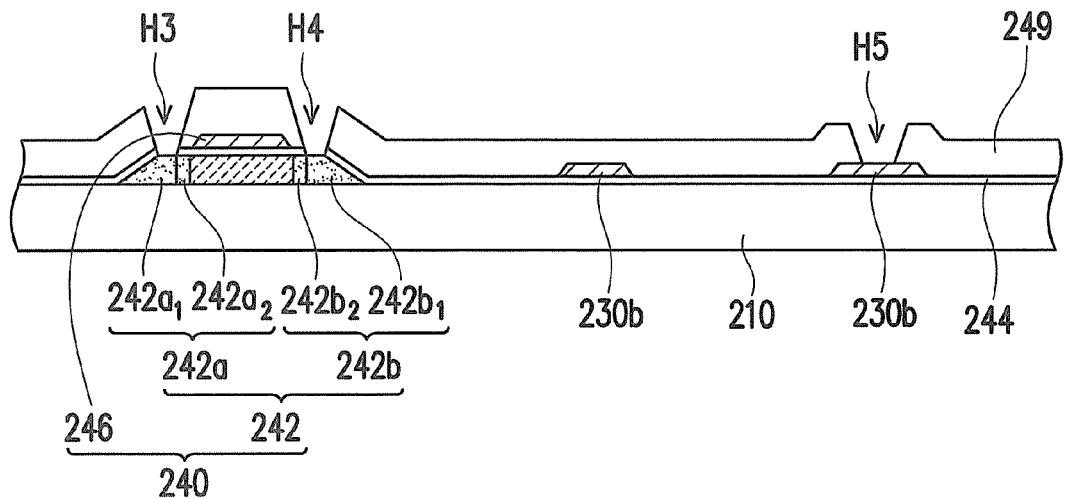

Next, as shown in FIG. 3D, a second dielectric layer 249 is formed on the substrate 210 to cover the active device 240, the scan line 220, and the bottom conductive wire 230b. Afterwards, openings H3, H4, and H5 are formed in the first dielectric layer 244 and the second dielectric layer 249 through a patterning process such as a photolithography process, an etching process, and so on. It is learned from FIG. 3D that the openings H3 and H4 are respectively disposed over the first doped regions $242a_1$ and $242b_1$, while the opening H5 is disposed over parts of the bottom conductive wire 230b. Here, the openings H3 and H4 are used to define the position at which the active device 240 connects to the upper conductive wire 230a and the pixel electrode 260. The opening H5 is used to connect the bottom conductive wire 230b and the upper conductive wire 230a. On the other hand, the material of the second dielectric layer 249 comprises, for example, silicon nitride, silicon oxide, SiON, silicon carbide, organic silicon, organic materials, other materials, or any combination thereof according to the present embodiment.

Figure 3E:
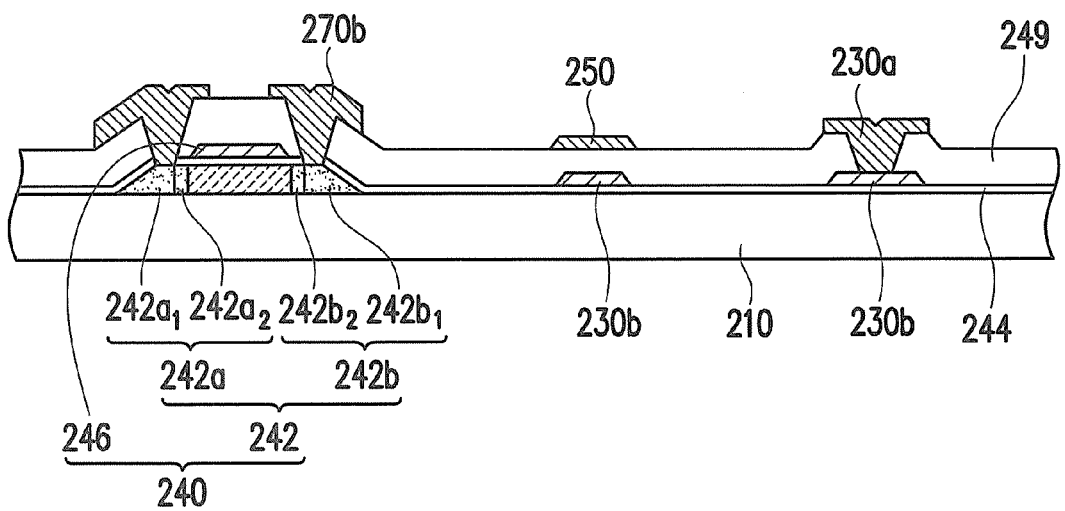

Next, as shown in FIG. 3E, after the second dielectric layer 249 and the first dielectric layer 244 are patterned, the upper conductive wire 230a and the shielding electrode 250 are formed on the second dielectric layer 249. Here, the shielding electrode 250 is disposed over the bottom conductive wire 230b. The upper conductive wire 230a is electrically connected to the active device 240 through the opening H3 and electrically connected to the bottom conductive wire 230b through the opening H5. It should be noted that at the time of forming the upper conductive wire 230a and the shielding electrode 250, a source (not shown) and a drain 270b are formed on the opening H4 according to the present embodiment. In other words, the source (not shown), the drain 270b, the shielding electrode 250, and the upper conductive wire 230a are formed by patterning the same material layer including aluminum (Al), molybdenum (Mo), titanium (Ti), neodymium (Nd), gold, copper, chromium, silver, tantalum, tin, iron, nitride thereof, oxide thereof, an alloy thereof, other material, or any combination thereof.

Figure 3F:
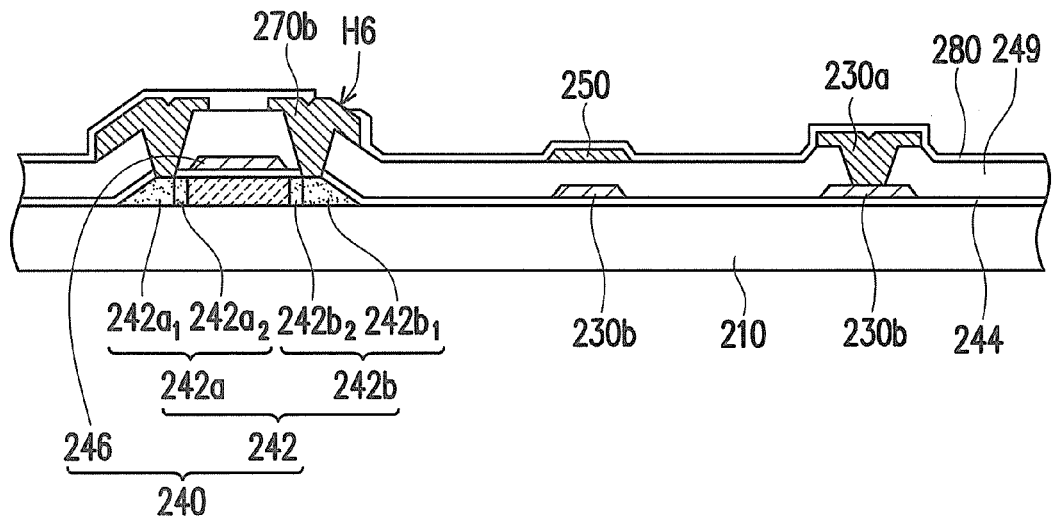

Referring to FIG. 3F. A passivation layer 280 is formed on the substrate 210, and an opening H6 is formed in the passivation layer 280 through the patterning process such as the photolithography process and the etching process. Here, the opening H6 is disposed over the drain 270b so as to expose at least a part of the drain 270b. The material of the passivation layer 280 comprises, for example, silicon nitride, silicon oxide, SiON, silicon carbide, organic silicon, organic materials, other materials, or any combination thereof according to the present embodiment.

Figure 1:
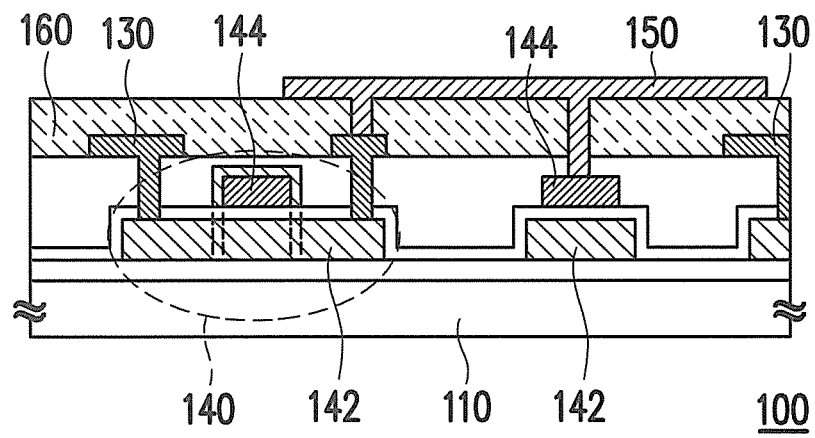
FIG. 1 is a schematic cross-sectional view of a conventional pixel structure.
Figure 3G:
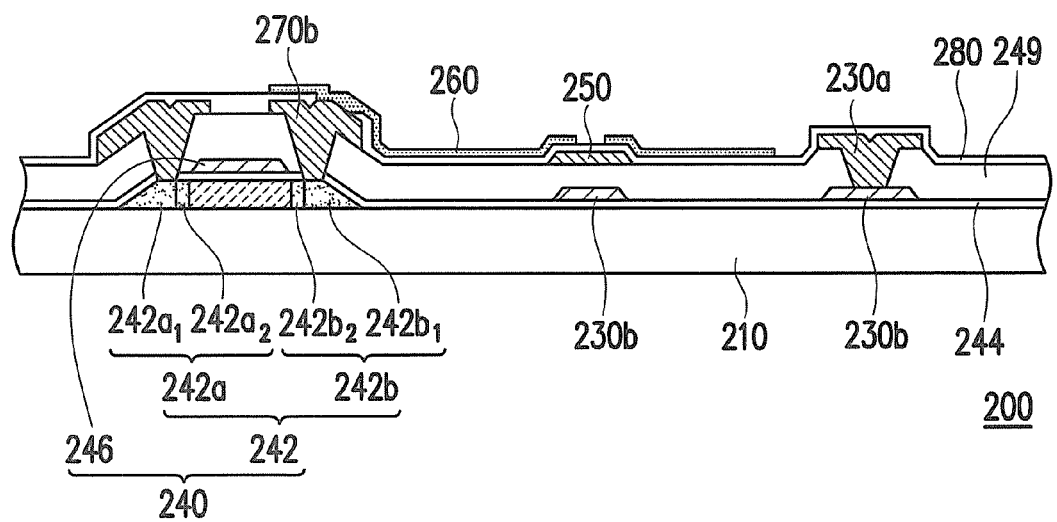

Next, as shown in FIG. 3G, after the passivation layer 280 is patterned, the pixel electrode 260 electrically connected to the drain 270b through the opening H6 is formed. Here, the pixel electrode 260 is electrically connected to the semiconductor layer 242 of the active device 240 through the drain 270b. The material of the pixel electrode 260 includes a transparent material e.g. indium tin oxide, indium zinc oxide, aluminum zinc oxide, zinc oxide, indium oxide, or others), a reflective conductive material (e.g. Al, Mo, Ti, Nd, gold, copper, chromium, silver, tantalum, tin, iron, nitride thereof, oxide thereof, an alloy thereof, other materials, or any combination thereof. One thing to be noted is that the drain 270b reduces the direct contact resistance between the pixel electrode 260 and the active device 240, such that the pixel electrode 260 receives the potential inputted by the active device 240. On the other hand, the pixel electrode 260 is disposed over part of the shielding electrode 250, and parts of the pixel electrode 260 and parts of the shielding electrode 250 form a storage capacitor. The main storage capacitor of the structure comprises parts of the pixel electrode 260 and parts of the shielding electrode 250, while the conventional manufacturing process as shown in FIG. 1 adopts the first metal layer 144 and the semiconductor layer 142 as main storage capacitor electrodes. Hence, the storage capacitor of the pixel structure 200 performs better than that provided in related art, for the ion doping step cannot be performed on the conventional semiconductor layer 242 with ease, thus leading to excessive driving potentials. After said step is completed, the pixel structure 200 is formed.

In the present embodiment, the design of the shielding electrode 250 of the pixel structure 200 results in a significant reduction of the influence of the data line 230 on the pixel electrode 260. And the shielding effect of the electrical field between the pixel electrode 260 and the data line 230 reduces the influence of the parasitical capacitance Cpd. Hence, in the technical field requiring high aperture ratio, the parasitical capacitance Cpd neither induces the cross-talk effect nor limits the design of the storage capacitance. Thereby, high transmittance of the pixel and desirable display quality can be accomplished.

Second Embodiment

FIGS. 4A through 4G are schematic views depicting the method for manufacturing the pixel structure according to a second embodiment of the present invention. The method for manufacturing the pixel structure in the present embodiment is similar to that in the first embodiment. The difference lies in the method of forming the source region 242a and the drain region 242b in the active device 240.

Figure 4A:
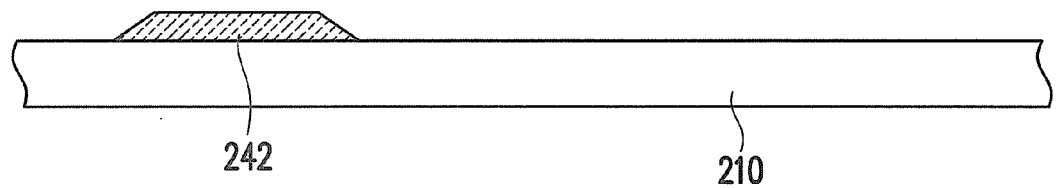
FIGS. 4A through 4G are schematic views depicting the method for manufacturing the pixel structure according to a second embodiment of the present invention.
Figure 4B:
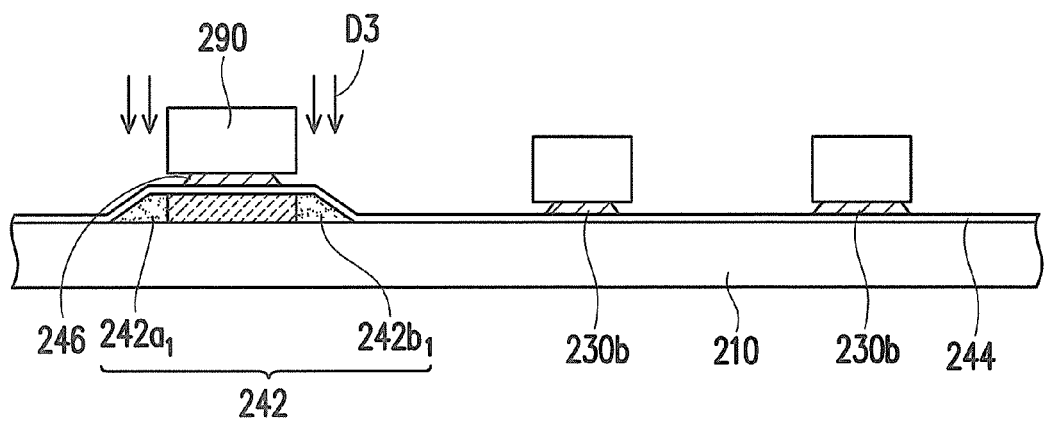

Referring to FIG. 4B. After the formation of the semiconductor layer 242 is not having any doped region, the first dielectric layer 244 is fanned on the substrate 210 to cover the semiconductor layer 242. Next, a second patterned photoresist layer 290 is formed on the first dielectric layer 244 so as to pattern the gate 246, the scan line 220, and the bottom conductive wire 230b. Then, through an etching process (e.g. an isotropic etching process or other processes), an undercut is formed on the gate 246, the scan line 220, and the bottom conductive wire 230b under the second patterned photoresist layer 290. In other words, a width of the second patterned photoresist layer 290 is substantially greater than a width of the gate 246. Thereafter, the second patterned photoresist layer 290 is used as a mask to perform a third doping process D3, such that the first doped regions $242a_1$ and $242b_1$ are formed. According to the present embodiment, the second patterned photoresist layer 290 has dual functions of being the mask for patterning the gate 246 and of being the mask for performing the third doping process D3. Here, the etching process is, for example, a wet etching process or others. And the third doping process D3 is a heavily doping process.

Figure 4C:
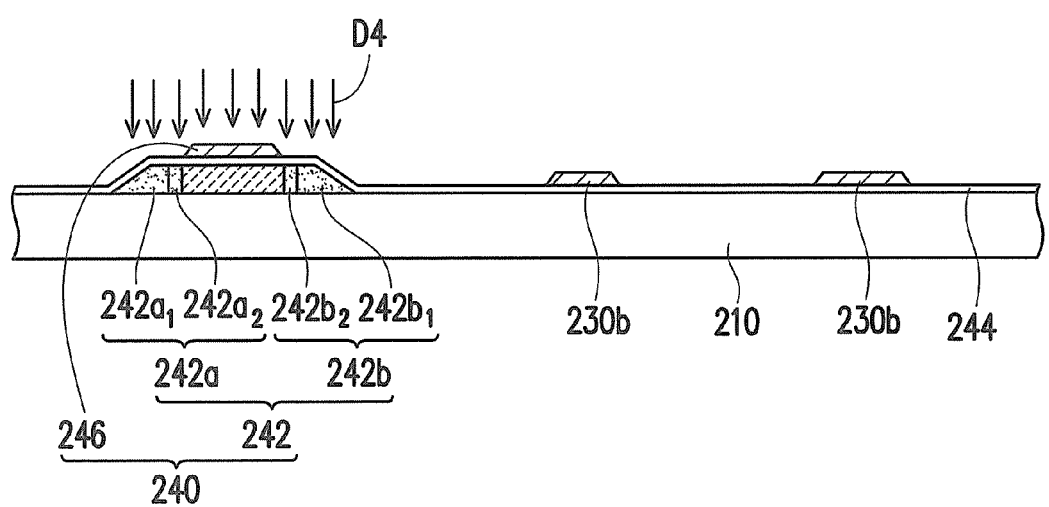
Figure 4D:
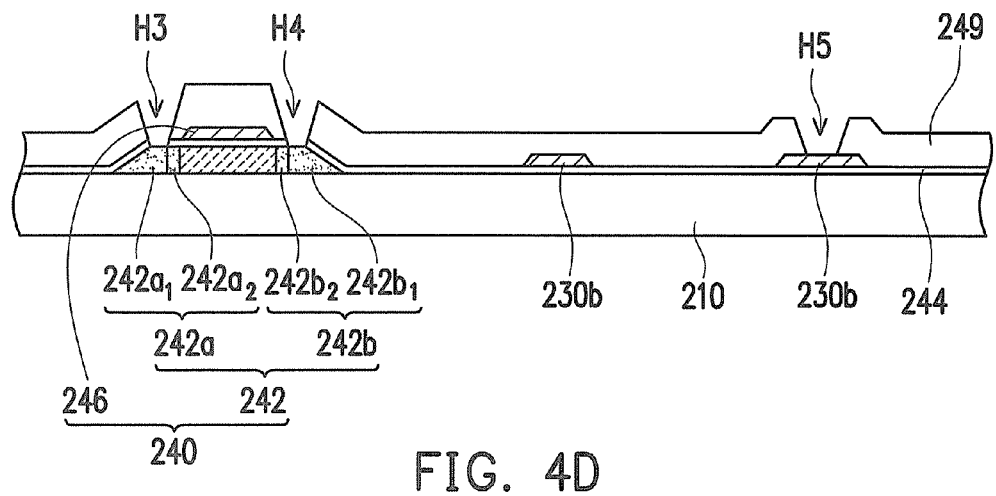
Figure 4E:
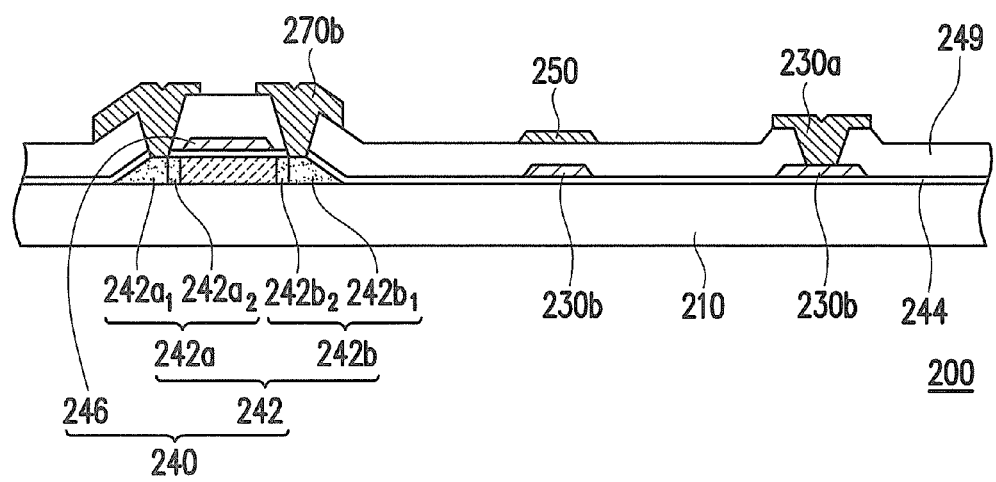
Figure 4F:
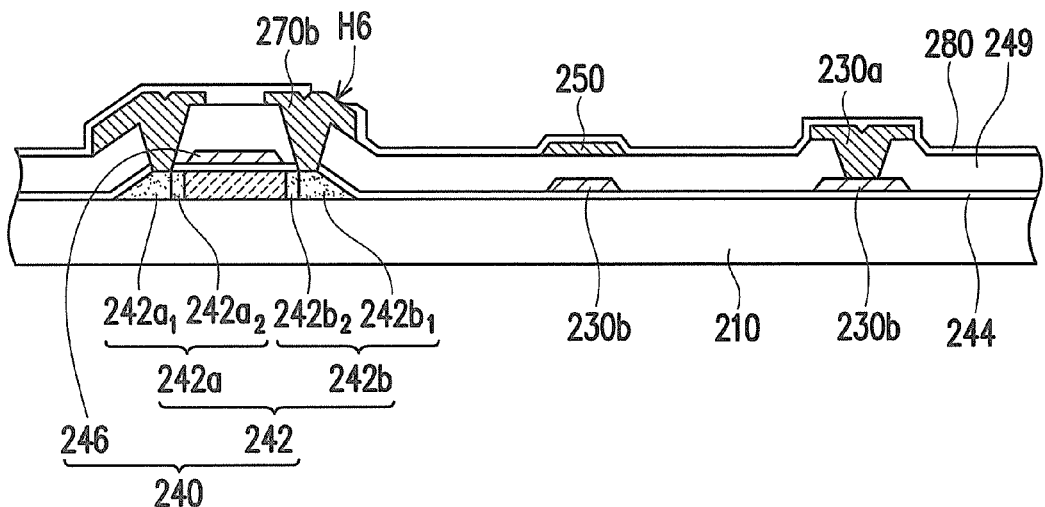
Figure 4G:
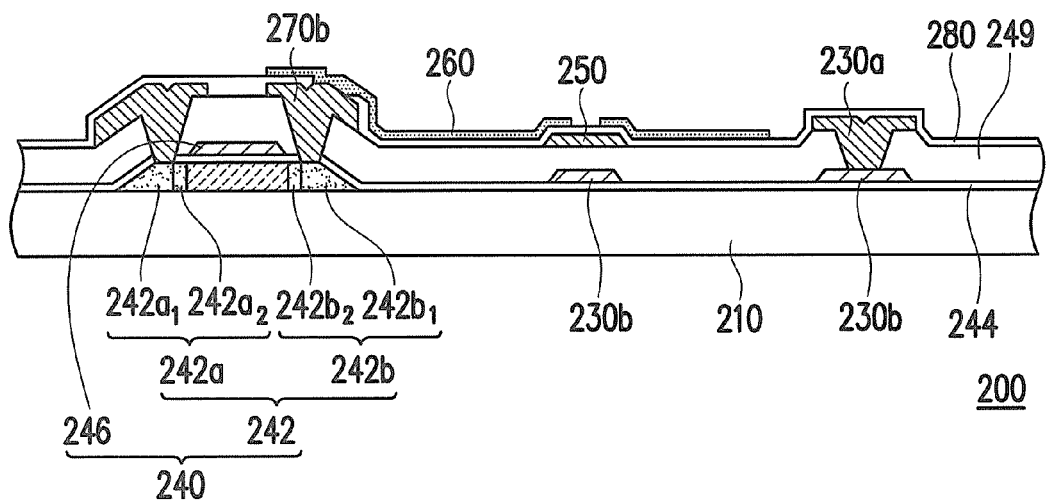

Next, as shown in FIG. 4C, the gate 246 is directly adopted as the mask to perform a fourth doping process D4 after the second patterned photoresist layer 290 is removed, so as to form the second doped regions $242a_2$ and $242b_2$ adjacent to the first doped regions $242a_1$ and $242b_1$, and to further form the source region 242a and the drain region 242b at the two sides of the semiconductor layer 242. The second doped regions $242a_2$ and $242b_2$ are foamed simultaneously and are located adjacent to the first doped regions $242a_1$ and $242b_1$ at the two sides of the semiconductor layer 242. In other embodiments, selectively only one of the second doped regions $242a_2$ and $242b_2$ is formed at one side of the first doped regions $242a_1$ or $242b_1$. In the present embodiment, the fourth doping process D4 is a lightly doping process. FIGS. 4D~4G representing subsequent processes are similar to FIGS. 3D~3G, and thus no further description is provided hereinafter.

Figure 5A:
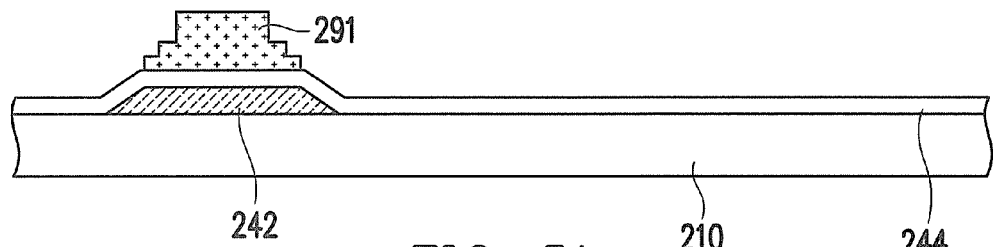
FIGS. 5A through 5D are schematic views depicting a method for manufacturing another active device of the present invention.
Figure 5B:
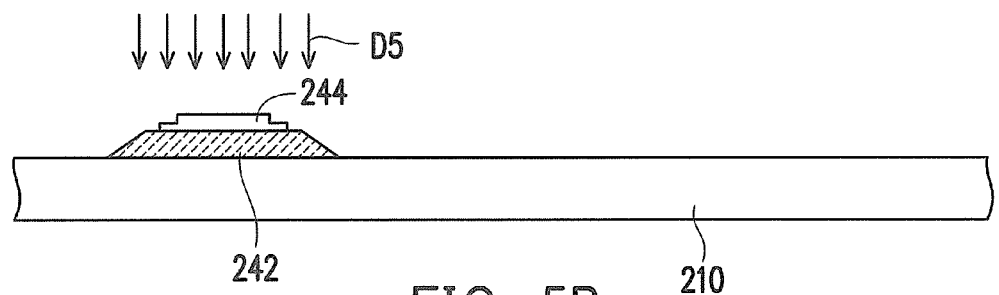
Figure 5C:
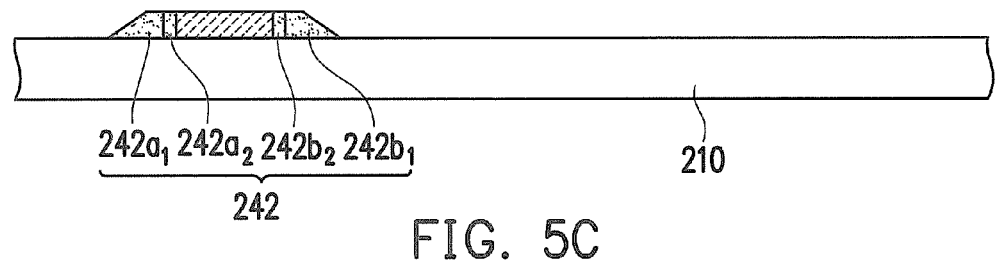
Figure 5D:
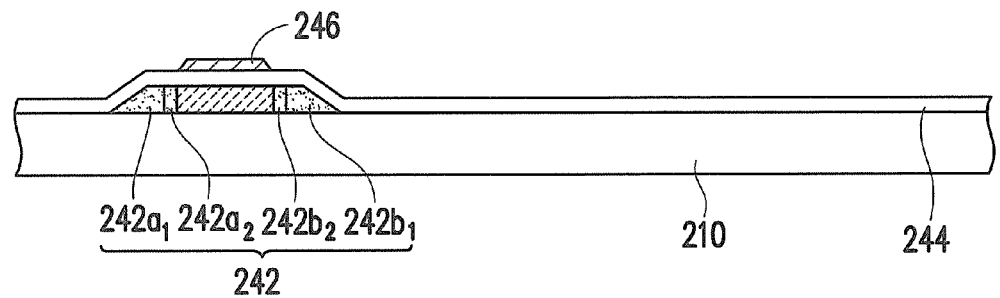

According to the above embodiments, the method of manufacturing the active device 240 of the pixel structure is performed as illustrated in FIGS. 3A through 3C and FIGS. 4A through 4C. Another method for manufacturing the active device 240 is further provided in the present invention, and the method includes the following figures which are subsequently depicted in FIGS. 5A through 5D. As shown in FIG. 5A, a semiconductor layer 242 is firstly formed on a substrate 210, and a first dielectric layer 244 is formed on a substrate 210 to cover the semiconductor layer 242. Next, a photoresist layer 291 substantially having a step shaped is formed on the first dielectric layer 244 such that the first dielectric layer 244 can be patterned through a patterning process, as shown in FIG. 5B, and the dielectric layer 244 substantially having the step shaped is formed on the semiconductor layer 242. Here, the method of aiming the step-shaped photoresist layer 291 includes, for example, using a half-tone photo-mask, a gray-tone photo-mask, a slit-patterned photo-mask, or a diffraction photo-mask to perform a photolithography process. Then, a fifth doping process D5 is performed. The dielectric layer 244 used as a mask has the step shaped, and thus, after the fifth doping process D5 is performed, the semiconductor layer 242 disposed under the dielectric layer 244 but not covered by the same forms first doped regions $242a_1$ and $242b_1$ at two sides of the semiconductor layer 242. The semiconductor layer 242 covered by a thinner region of the dielectric layer 244 forms second doped regions $242a_2$ and $242b_2$ in the semiconductor layer 242 after the fifth doping process D5 is performed. As shown in FIG. 5C, the second doped regions $242a_2$ and $242b_2$ are formed simultaneously and disposed adjacent to the first doped regions $242a_1$ and $242b_1$ at the two sides of the semiconductor layer 242. According to other embodiments, selectively only one of the second doped regions $242a_2$ and $242b_2$ is formed. Thereafter, as shown in FIG. 5D, the dielectric layer 244 is again formed on the semiconductor layer 242 having the doped regions formed thereon. Next, a gate 246 is formed on the dielectric layer 242 and disposed over the semiconductor layer 242. In the present embodiment, an etching process is performed to remove the dielectric layer having the step shaped, and then the dielectric layer 244 is formed on the semiconductor layer 242 having the doped regions formed thereon. However, preferred it is desirable that the dielectric layer 244 may be directly formed on the semiconductor layer 242 having the doped regions and on the step-shaped dielectric layer in the absence of removing the step-shaped dielectric layer. Thereby, one etching process is omitted and the manufacturing costs can be further reduced.

Figure 6A:
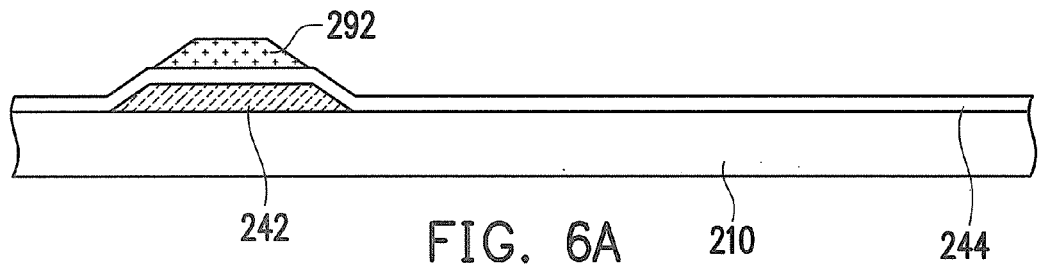
FIGS. 6A through 6D are schematic views depicting a method for manufacturing still another active device of the present invention.
Figure 6B:
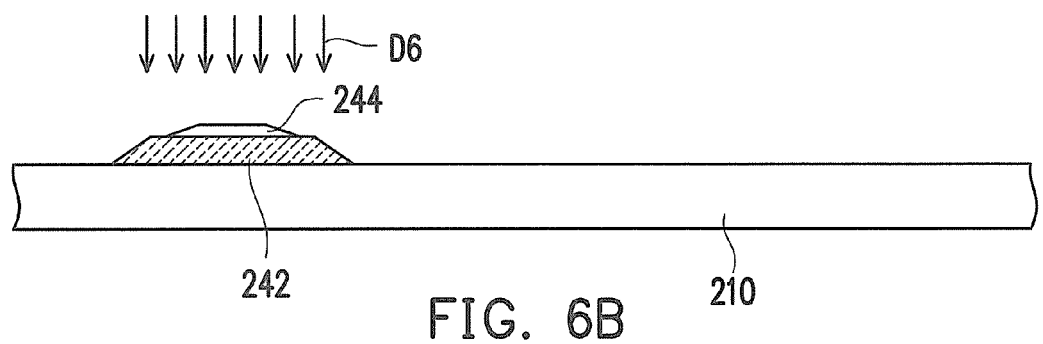
Figure 6C:
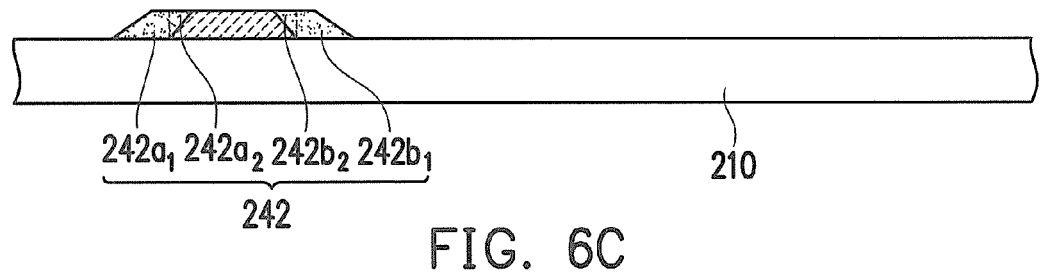
Figure 6D:
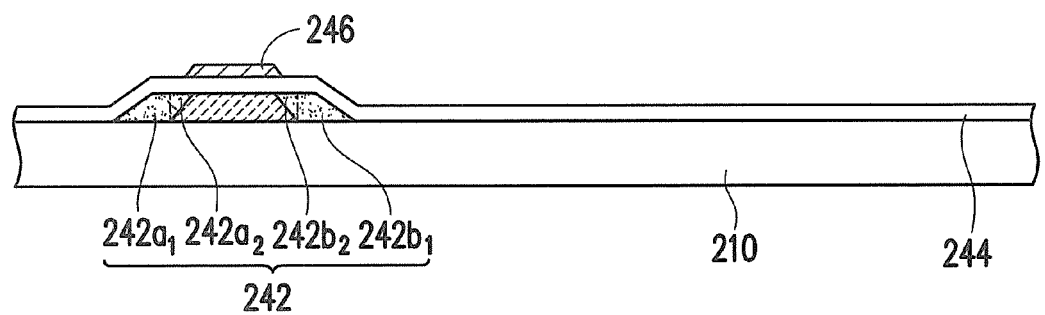

The present invention further provides a manufacturing method of the active device 240. The method includes the following figures which are subsequently depicted in FIGS. 6A through 6D. With reference to FIG. 6A, a semiconductor layer 242 is formed on a substrate 210, and a first dielectric layer 244 is formed on a substrate 210 to cover the semiconductor layer 242. Next, a photoresist layer 292 substantially having a tapered shaped is formed on first dielectric layer 244 such that the first dielectric layer 244 can be patterned through a patterning process. As shown in FIG. 6B, the dielectric layer 244 substantially having the tapered shaped is formed on the semiconductor layer 242. Next, a sixth doping process D6 is performed. The dielectric layer 244 used as the mask has the tapered shaped, and thus, after the sixth doping process D6 is performed, the thinner the dielectric layer 244 is the higher the dopant concentration of the semiconductor layer 242. As shown in FIG. 6C, after the sixth doping process D6 is performed, the semiconductor layer 242 disposed under the taper-shaped dielectric layer 244 but not covered by the same forms first doped regions $242a_1$ and $242b_1$ at two sides of the semiconductor layer 242. The semiconductor layer 242 covered by a thinner region of the dielectric layer 244 forms second doped regions $242a_2$ and $242b_2$ in the semiconductor layer 242 after the sixth doping process D6 is performed. Here, the concentration of the second doped regions $242a_2$ and $242b_2$ is taperingly distributed. As shown in FIG. 6C, the second doped regions $242a_2$ and $242b_2$ are formed simultaneously and disposed adjacent to the first doped regions $242a_1$ and $242b_1$ at the two sides of the semiconductor layer 242. According to other embodiments, selectively only one of the second doped regions $242a_2$ and $242b_2$ is formed. Thereafter, as shown in FIG. 6D, the dielectric layer 244 is again formed on the semiconductor layer 242 having the doped regions formed thereon. Next, a gate 246 is formed on the dielectric layer 242 and disposed over the semiconductor layer 242. In the present embodiment, an etching process is performed to remove the taper-shaped dielectric layer, and then the dielectric layer 244 is formed on the semiconductor layer 242 having the doped regions formed thereon. However, preferred it is desirable that the dielectric layer 244 is directly formed on the semiconductor layer 242 having the doped regions and on the taper-shaped dielectric layer in the absence of removing the taper-shaped dielectric layer. Thereby, one etching process is omitted and the manufacturing costs can be reduced.

Figure 7A:
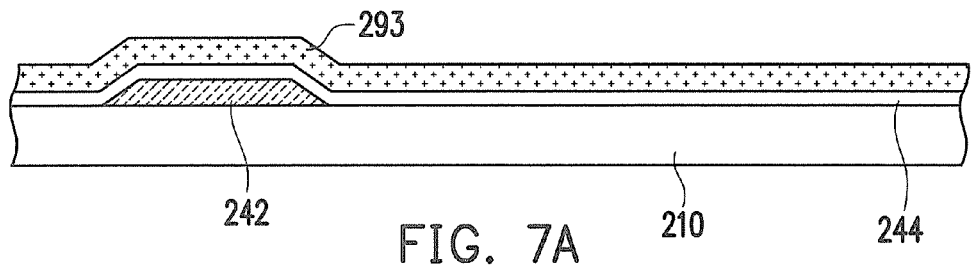
FIGS. 7A through 7D are schematic views depicting a method for manufacturing yet still another active device of the present invention.
Figure 7B:
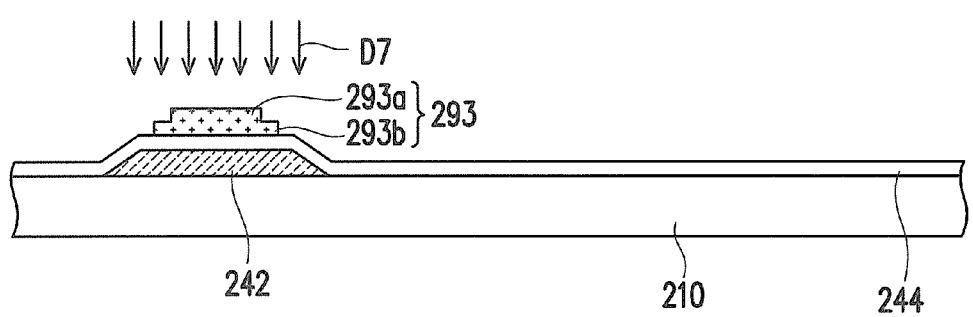
Figure 7C:
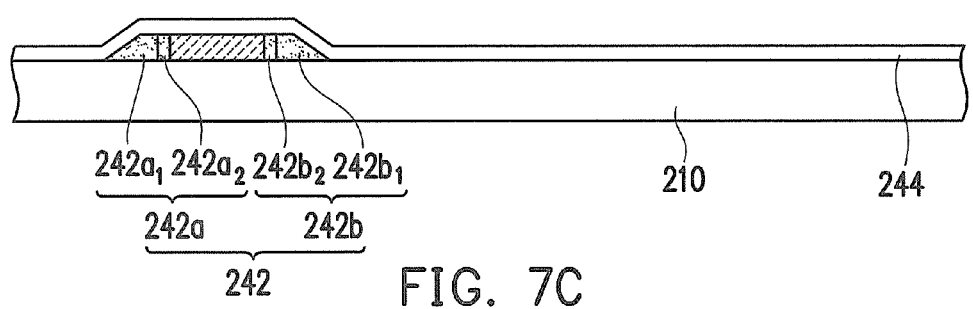
Figure 7D:
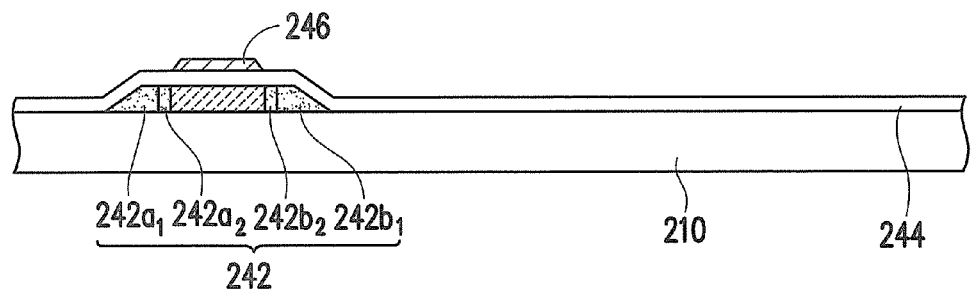

The present invention further provides a method for manufacturing the active device 240. The method includes the following figures which are subsequently depicted in FIGS. 7A through 7D. As shown in FIG. 7A, a semiconductor layer 242 is firstly formed on a substrate 210, and a dielectric layer 244 is formed to cover the semiconductor layer 242. Then, as shown in FIG. 7B, a photoresist layer 293 including a thick region 293a and a thin region 293b is formed on the dielectric layer 244. Here, the method of forming the photoresist layer 293 includes, for example, using a half-tone photo-mask, a gray-tone photo-mask, a slit-patterned photo-mask, or a diffraction photo-mask to perform a photolithography process. Then, a seventh doping process D7 using the photoresist layer 293 as a mask is performed. As shown in FIG. 7C, first doped regions $242a_1$ and $242b_1$ are formed at two sides of the semiconductor layer 242, and second doped regions $242a_2$ and $242b_2$ adjacent to the first doped regions $242a_1$ and $242b_1$ at two sides of the semiconductor layer 242 are formed simultaneously. According to other embodiments, selectively only one of the second doped regions $242a_2$ and $242b_2$ is formed. Thereafter, as shown in FIG. 7D, a gate 246 is formed on the dielectric layer 244 and disposed over the semiconductor layer 242.

It should be noted that the embodiments of the present invention are illustrated on the premise that no semiconductor layer is disposed under the bottom electrode 230b. However, if deemed necessary, semiconductors may still exist in the dielectric layer 244 under the bottom electrode 230b acts as auxiliary storage capacitor, and preferred the auxiliary storage capacitor is the part of the storage capacitors.

Figure 8:
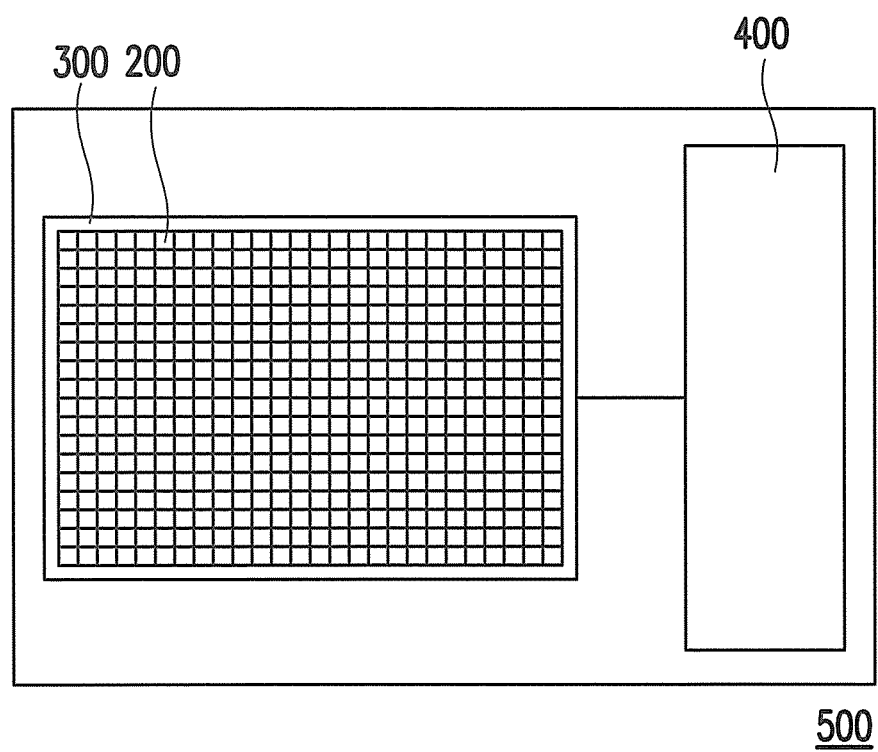
FIG. 8 is a schematic view depicting an electro-optic apparatus constructed by the pixel structure of the present invention.

Moreover, as shown in FIG. 8, the display panel 300 including the pixel structure 200 arranged in array and described in the above embodiments can form a electro-optic apparatus 500 together with an electronic device 400. The electronic device 400 includes a control device, an operating device, a processing device, an input device, a memory device, a driving device, a light emitting device, a protection device, a sensing device, a detecting device, other devices having other functions, or any combination thereof. And the electro-optic apparatus 500 includes portable products (e.g. mobile phones, camcorders, cameras, laptop computers, game players, watches, music players, e-mail receivers and senders, map navigators, or the like), audio-video products (e.g. audio-video players or the like), screens, televisions, bulletins, panels in projectors, and so on. In addition, the display panel 300 includes LCDs or organic electro-luminescent display panels. Generally, and the display medium of the display panel is electrically connected to the pixel electrode and/or the drain. The display medium may be a liquid crystal layer, or an organic light-emitting layer (e.g. small molecules, macromolecules, or any combination thereof), or any combination thereof.

In summary, the pixel structure and the manufacturing method of the pixel structure provided by the present invention have at least the following advantages:

1. In one embodiment of the present invention, the shielding electrode of the pixel structure reduces the influence of the data line on the potential of the display pixel electrode during signal transmission, such that the cross-talk effect is reduced and the display quality is further improved.

2. In one embodiment of the present invention, the shielding electrode significantly reduces the influence of the data line on the pixel electrode, and thereby the parasitical capacitance Cpd between the pixel electrode and the data line is too small to be noticed. Accordingly, for one of ordinary skill in the art, the design of the pixel structure is free from the limitation of the parasitical capacitance Cpd. The pixel electrode is then extended over the data line to increase the aperture ratio of the pixel and to further improve the display brightness of the LCDs.

3. In one embodiment of the present invention, the storage capacitor of the structure is comprised of the pixel electrode and the shielding electrode, while the conventional manufacturing process adopts the first metal layer and the semiconductor layer as storage capacitor electrodes. Hence, the storage capacitor of the pixel structure performs better than that provided in related art, since the ion doping process cannot be performed on the conventional semiconductor layer easily, thus leading to excessive driving potentials.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a pixel structure on a substrate, comprising:
   forming an active device, a scan line, and a bottom conductive wire on the substrate, wherein the active device is electrically connected to the scan line;
   forming an upper conductive wire and a shielding electrode, wherein the shielding electrode is disposed over the bottom conductive wire, and the upper conductive wire is electrically connected to the active device; and
   forming a pixel electrode over part of the shielding electrode and electrically connected to the active device, wherein part of the pixel electrode and part of the shielding electrode formed a storage capacitor.

2. The method of claim 1, further comprising forming a drain, wherein the pixel electrode is connected to the active device through the drain.

3. The method of claim 1, wherein the drain, the shielding electrode, and the upper conductive wire are formed by patterning the same material layer.

4. The method of claim 1, wherein the formation of the active device comprise:
   forming a semiconductor layer on the substrate;
   forming a dielectric layer on the substrate and covering the semiconductor layer;
   forming a gate on the dielectric layer, wherein the gate is aligned with the semiconductor layer; and
   forming a first doped region at two sides of the semiconductor layer.

5. The method of claim 4, wherein the formation of the first doped region comprises:
   forming a patterned photoresist layer on the dielectric layer, the patterned photoresist layer exposing the two sides of the semiconductor layer and being used as a mask when performing a first doping process.

6. The method of claim 5, further comprising forming a second doped region in the semiconductor layer, the second doped region being adjacent to at least one of the first doped regions at the two sides of the semiconductor layer.

7. The method of claim 6, wherein the formation of the second doped region comprises:
   using the gate as the mask to perform a second doping process after the gate is formed.

8. The method of claim 4, wherein the formation of the first doped region at the two sides of the semiconductor layer comprises using the patterned photoresist layer as the mask to perform the first doping process, the patterned photoresist layer being used to define the gate.

9. The method of claim 8, further comprising forming a second doped region in the semiconductor layer, the second doped region being adjacent to at least one of the first doped regions at the two sides of the semiconductor layer.

10. The method of claim 9, wherein the formation of the second doped region comprises:
    using the gate as the mask to perform a second doping process after the gate is formed.

11. The method of claim 1, wherein the formation of the active device comprise:
    forming a semiconductor layer on the substrate;
    forming a dielectric layer on the semiconductor layer, the dielectric layer having a substantially stepped shape;
    forming a first doped region at the two sides of the semiconductor layer;
    forming a second doped region in the semiconductor layer, the second doped region being adjacent to at least one of the first doped regions at the two sides of the semiconductor layer; and
    forming a gate on the dielectric layer, wherein the gate is aligned with the semiconductor layer.

12. The method of claim 1, wherein the formation of the active device comprise:
    forming a semiconductor layer on the substrate;
    forming a dielectric layer on the semiconductor layer, the dielectric layer having a substantially taper shaped;
    forming a first doped region at the two sides of the semiconductor layer;
    forming a second doped region in the semiconductor layer, the second doped region being adjacent to at least one of the first doped regions at the two sides of the semiconductor layer; and
    forming a gate on the dielectric layer, wherein the gate is aligned with the semiconductor layer.

13. The method of claim 1, wherein the formation of the active device comprise:
    forming a semiconductor layer on the substrate;
    forming a dielectric layer on the semiconductor layer;
    forming a first doped region at the two sides of the semiconductor layer;
    forming a second doped region in the semiconductor layer, the second doped region being adjacent to at least one of the first doped regions at the two sides of the semiconductor layer; and
    forming a gate on the dielectric layer, wherein the gate is aligned with the semiconductor layer.

14. The method of claim 13, wherein the formation of the first and the second doped regions comprise:
    forming a photoresist layer on the dielectric layer, wherein the photoresist layer comprises a thick region and a thin region; and
    using the photoresist layer as the mask to perform a doping process.

* * * * *